United States Patent
Schondelmaier et al.

(10) Patent No.: US 7,055,468 B2
(45) Date of Patent: Jun. 6, 2006

(54) DRIVE ARRANGEMENT FOR A MOTOR VEHICLE

(75) Inventors: Andreas Schondelmaier, Erdmannshausen (DE); Dirk Sundheim, Stuttgart (DE)

(73) Assignee: DaimlurChrysler A.G., Stuttgart (DE)

( * ) Notice: Subject to any disclaimer, the term of this patent is extended or adjusted under 35 U.S.C. 154(b) by 64 days.

(21) Appl. No.: 10/801,181

(22) Filed: Mar. 13, 2004

(65) Prior Publication Data

US 2004/0206313 A1    Oct. 21, 2004

(30) Foreign Application Priority Data

Mar. 14, 2003   (DE)   ................... 103 11 644

(51) Int. Cl.
*H02M 1/00*    (2006.01)

(52) U.S. Cl. .................................. 123/41.31

(58) Field of Classification Search ............ 123/41.31, 123/41.01, 41.02
See application file for complete search history.

(56) References Cited

U.S. PATENT DOCUMENTS

| | | | | |
|---|---|---|---|---|
| 4,763,611 | A | * | 8/1988 | Kobayashi et al. ...... 123/41.31 |
| 4,893,590 | A | * | 1/1990 | Kashimura et al. ...... 123/41.31 |
| 4,951,636 | A | * | 8/1990 | Tuckey et al. .............. 123/497 |
| 5,207,186 | A | * | 5/1993 | Okita ....................... 123/41.31 |
| 6,396,692 | B1 | * | 5/2002 | Farshi et al. ................. 361/690 |
| 6,604,494 | B1 | * | 8/2003 | Skrzypchak et al. ..... 123/41.31 |
| 6,644,249 | B1 | * | 11/2003 | Itakura et al. ........... 123/41.31 |
| 6,655,326 | B1 | * | 12/2003 | Purcell et al. ........... 123/41.31 |
| 6,694,929 | B1 | * | 2/2004 | Skrzypchak et al. ..... 123/41.31 |

FOREIGN PATENT DOCUMENTS

| | | |
|---|---|---|
| DE | 199 13 450 A1 | 9/2000 |
| DE | 100 09 521 A1 | 8/2001 |

* cited by examiner

*Primary Examiner*—Noah P. Kamen
*Assistant Examiner*—Jason Benton
(74) *Attorney, Agent, or Firm*—Klaus J. Bach

(57) ABSTRACT

In a drive arrangement for a motor vehicle, comprising an internal combustion engine and a power electronic unit for controlling an electric machine, the power electronic unit is arranged on a carrier and the carrier comprises a cooler which includes coolant passages and is mounted on the engine such that the coolant passages are in direct communication with coolant passages of a cooling circuit of the internal combustion engine.

5 Claims, 2 Drawing Sheets

DRIVE ARRANGEMENT FOR A MOTOR VEHICLE

BACKGROUND OF THE INVENTION

The invention relates to a drive arrangement for a motor vehicle, comprising an internal combustion engine and a power electronic unit for controlling an electric machine.

Power electronic units which are used in vehicles, in particular for controlling electric machines, are frequently subjected to strong vibrations and to the generation of a large amount of heat. In order to permit the power electronic unit to be attached in the motor vehicle in a vibration-free fashion, heavy mounting structures in the form of die-cast components which are of complex construction and expensive are usually used.

It is the object of the invention to provide a drive arrangement for a motor vehicle, comprising an internal combustion engine and a power electronic unit for controlling an electric machine which is distinguished by a compact design and low weight.

SUMMARY OF THE INVENTION

In a drive arrangement for a motor vehicle, comprising an internal combustion engine and a power electronic unit for controlling an electric machine, the power electronic unit is arranged on a carrier and the carrier comprises a cooler which includes coolant passages and is mounted on the engine such that the coolant passages are in direct communication with coolant passages of a cooling circuit of the internal combustion engine.

In the drive arrangement according to the invention, the electronic power unit is disposed on a carrier which comprises a cooler which is connected to a cooling circuit of an internal combustion engine. The carrier, which is preferably in the form of a cooled structure, or a heat sink structure for the power electronic unit, is so designed that it can firmly support the power electronic unit. The coolant, in particular a cooling liquid, is preferably branched off from the cooling circuit of the internal combustion engine at the engine block of the internal combustion engine.

By configuring the carrier as a cooler, the need for an additional component is eliminated. This provides for a saving in cost and weight.

The carrier is preferably positively attached to the engine casing, in particular the cylinder block of the internal combustion engine. The connection of the power electronic unit by means of a carrier in the form of a cooler to the internal combustion engine is distinguished by a high degree of resistance to vibration.

The carrier of the power electronic unit is preferably attached directly to the engine, in particular to the engine block. The power electronic unit with the carrier in the form of a cooler is for example attached to the engine at the attachment points for a conventional alternator which are provided on an internal combustion engine, in particular on the engine block. This advantageously uses the installation space for a customarily provided alternator, and there is no need for changing or for providing any additional attachment points.

The electric machine which is energized by the power electronic unit is preferably a three-phase machine which is suitable for a starter/generator operating mode (for example an asynchronous machine, a synchronous machine, a reluctance machine) which can be used in particular for starting, for enhancing engine power generation (known as boosting) and/or for recovering braking energy in an energy accumulator which is provided for this purpose. The electric machine may be embodied as a belt-driven starter/generator. It may also be in the form of an integrated starter/generator which is arranged between an internal combustion engine and a gearbox on a crankshaft or a gearbox input shaft. Further embodiments are conceivable.

The invention will be described in greater detail on the basis of exemplary embodiments which are illustrated below with reference to the accompanying drawings:

DESCRIPTION PREFERRED EMBODIMENTS

Figure 1:
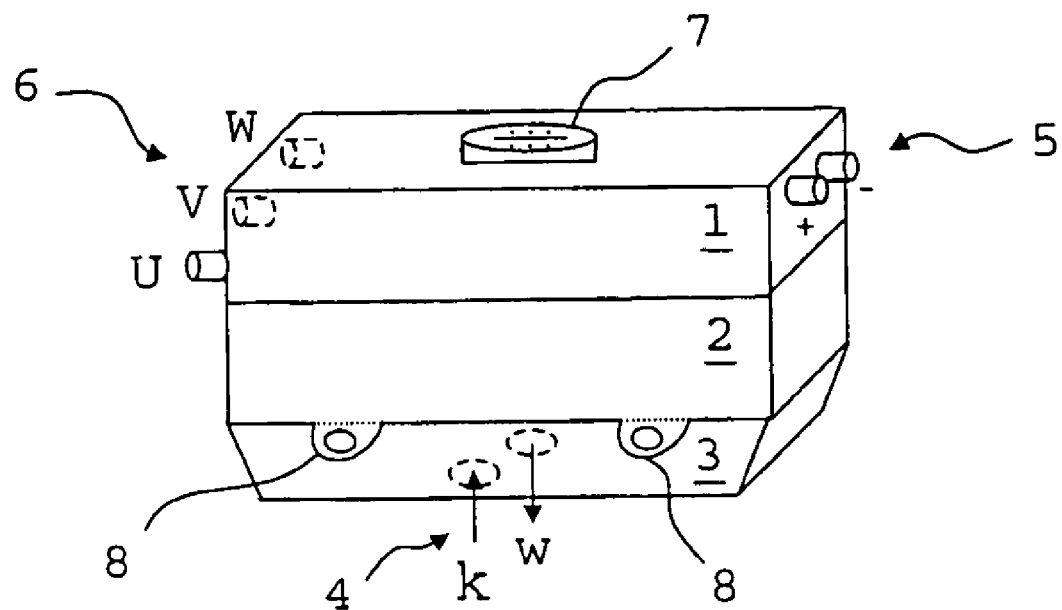
FIG. 1 is a perspective view of a power electronic unit having a carrier which at the same time forms a heat sink.

In the drawings components which are identical or have identical functional effects are provided with the same reference symbols.

FIG. 1 shows a power electronic unit 1 (preferably in or with a casing) which is supported on a carrier 2, 3. The carrier is preferably composed of an upper part 2 and a lower part 3. The terms "upper" and "lower" relate here to the power electronic unit 1. The upper part 2 is arranged between the power electronic unit 1 and the lower part 3. The lower part 3 of the carrier includes coolant channels 4, for feeding in and carrying away a coolant, the coolant being preferably extracted from an engine cooling circuit, a cylinder block and/or a cylinder head of an internal combustion engine (not illustrated). The coolant is fed back to the cooling circuit after passing through the carrier 2, 3. The use of other coolants (for example a gas, such as air) and/or connections to other cooling circuits (for example to a low-temperature flow circuit which is provided in the internal combustion engine) is also possible. The feeding in of coolant is indicated in FIG. 1 and in the further figures by an arrow which is designated by "k". The carrying away of the coolant is indicated in FIG. 1 and in the further figures by an arrow which is designated by "w".

The upper part 2 of the carrier is preferably a cooler. It may be provided with attachment means 8 which may be eyelets by way of which the carrier and the power electronic unit 1 are mounted to the internal combustion engine, in particular to the engine block. The attachment means B are preferably arranged where the upper part 2 of the carrier adjoins the lower part 3 of the carrier. It is of course possible for the attachment means also to be provided on the lower part 3 of the carrier, in particular where the lower part 3 of the carrier adjoins the upper part 2 of the carrier and forms an adapter plate. The carrier with the power electronic unit 1 is preferably attached to the internal combustion engine at the location or at the attachment points at which an alternator or a standard generator is usually mounted. The lower part or adapter plate 3 includes passages 4 for supplying coolant from a particular engine to the upper part or cooler 2.

Figure 4:
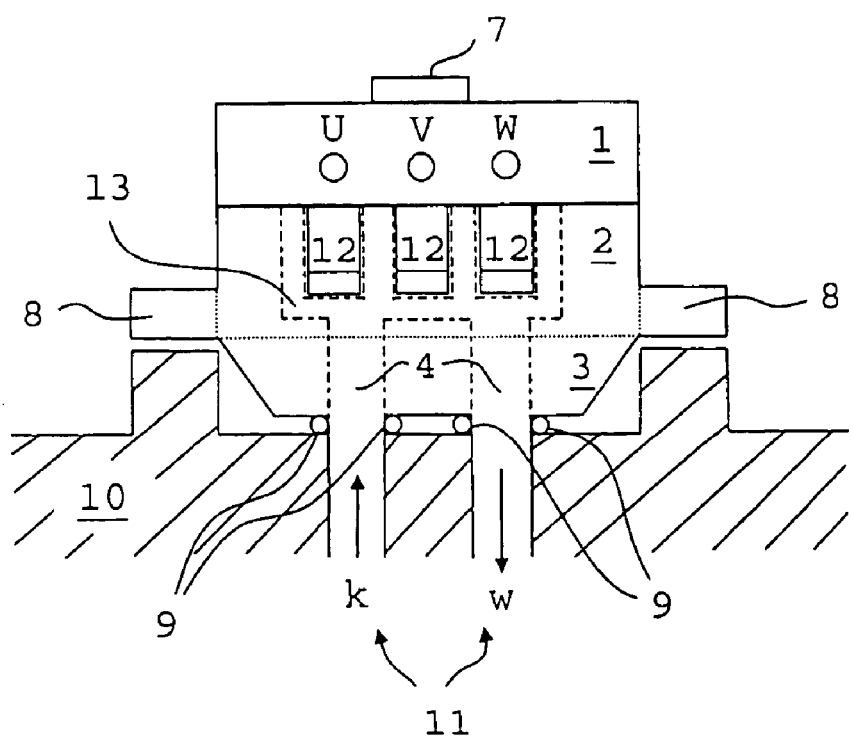
FIG. 4 is a longitudinal sectional view of part of an engine and a power electronic unit mounted on a carrier structure forming a cooler.

The power electronic unit 1 has terminals 5 for connection to an electric power supply (not illustrated), in particular an energy accumulator, for example a 12 volt and/or a 42 volt energy accumulator such as a battery. Furthermore, the power electronic unit 1 has terminals 6 supplying electric power to an electric machine (not illustrated) which preferably can be used as a starter/generator. The electric machine is preferably a three-phase machine, and by way of example three phases 6 (U, V, W) are illustrated in FIGS. 1 and 4.

Furthermore, the power electronic unit 1 has a control signal connection 7 via which control signals or regulating signals are fed to the power electronic unit 1, and measurement variables or state variables can be transmitted by the power electronic unit 1. The control signals or regulating signals are determined by a control unit (not illustrated) of the internal combustion engine and/or the motor vehicle and are transmitted to the control signal connection 7. The measurement variables or state variables of the power electronic unit 1 are preferably evaluated by the control unit and used as the basis for determining the control signals.

The connections 5, 6, 7 are arranged so as to be easily accessible for mounting and servicing.

Figure 2:
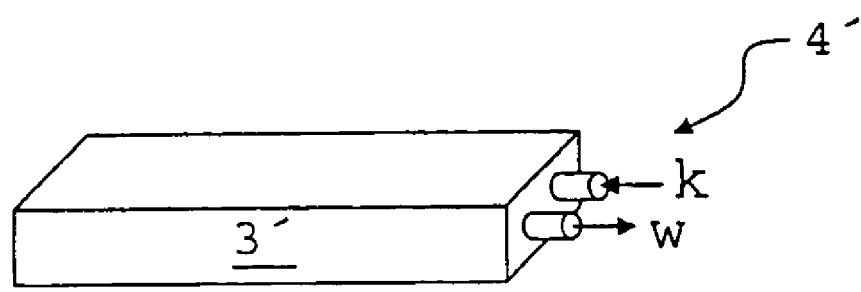
FIG. 2 is a perspective view of a further embodiment of a lower part of a carrier in the form of a heat sink.

FIG. 2 shows an alternative embodiment of the lower part 3' of the carrier. In this embodiment, lines or line connections are provided laterally on the lower part 3 in order to circulate coolant through the cooler.

The electronic unit 1 may be a standard part. The carrier 2, 3 comprises a cooler 2 and an adapter plate 3 with a coolant inlet and a coolant outlet 4. It can comprise an upper part 2, which s preferably provided with attachment means 8, and a lower adapter plate part 3 for connection to the cooling circuit of the internal combustion engine, preferably the engine block. The carrier 2, 3 can of course also be a single part, wherein the upper part 2 and the lower part 3 are combined in a single part which is designed for a particular engine.

Figure 3:
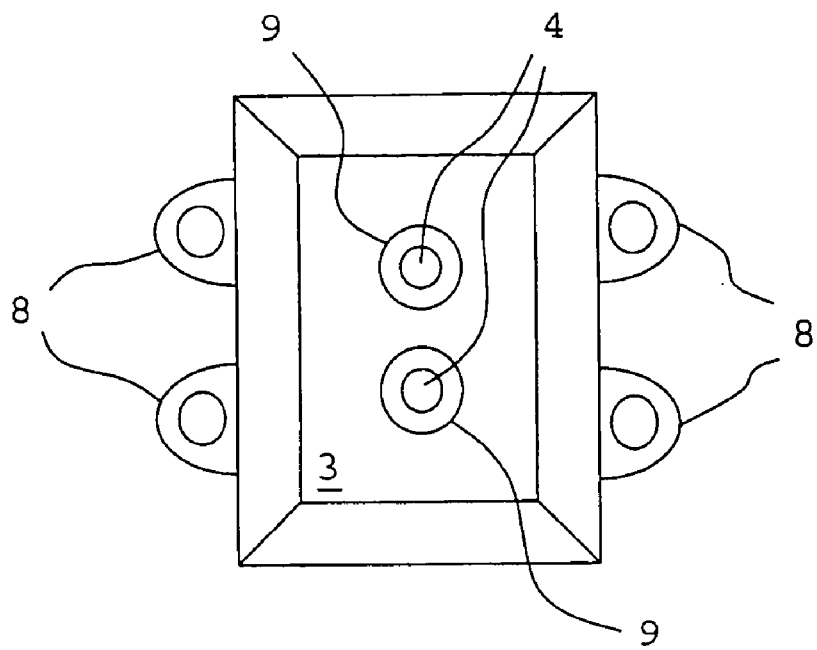
FIG. 3 is a bottom a view of a carrier which a heat sink.

FIG. 3 is a bottom view of the carrier 2, 3. The carrier 2, 3, particularly the lower part 3, is preferably supported in a positively engaging fashion on the engine block of the internal combustion engine. The lower part 3 of the carrier may be in the form of a truncated pyramid or an obelisk, in which the larger base surface adjoins the upper part 2, and the smaller cover surface has openings 4 for feeding in and carrying away coolant. Seals 9, in particular seal rings, are provided on the edges of the openings 4. Preferably the attachment means 8 are provided at freely accessible sides of the carrier 2, 3 adjacent the power electronic unit 1 on which preferably no current or voltage feed in connections 5, 6 and/or no signal connections 7 are provided.

FIG. 4 illustrates a longitudinal section through a drive arrangement according to the invention with an internal combustion engine 10 and a power electronic unit 1 which is arranged on a carrier 2, 3. The internal combustion engine 10 preferably has coolant supply and return passages 11, said passages 11 being part of a cooling circuit of the internal combustion engine. These passages 11 are aligned with the passages 4 of the carrier 2, 3 for conducting the coolant to and out of the carrier 2. For different engines, different adapter plates 3 are provided with coolant passages 4 arranged so as to fit the coolant passages 11 of the particular engine. A seal 9, in particular seal rings, is arranged between the carrier 2, 3 and the engine 10 for sealing the feed and carrying away coolant through the coolant passages 11 (that is to say between the carrier 2, 3 and the engine block)

The attachment means 8 are preferably disposed in recesses in the engine block 10. These recesses are preferably suitable for holding screws or corresponding attachment means extending through the attachment means 8 which are preferably in the form of eyelets.

Condensers 12 are illustrated with semiconductor elements which are arranged in the power electronic unit 1 and which project into the upper part 2—configured as a cooler—of the carrier. The upper part 2 of the carrier preferably has lines/channels/deflection means 13, in particular passages, which adjoin the channels 4 for feeding in and/or carrying away coolant. They provide for the cooling of the power electronic unit 1 or the semiconductor elements arranged on it and the electrical lines (illustrated for example by means of the capacitors 12), which are routed correspondingly. The capacitors 12 are preferably surrounded by the lines 13.

The coolant channels 4, 13 which extend in the carrier 2, 3 are illustrated by dash-dotted lines in FIG. 4. The transitions between the upper part 2 of the carrier and the lower part 3 and the attachment means 8 are illustrated by means of dotted lines.

What is claimed is:

1. A drive arrangement for a motor vehicle, comprising an internal combustion engine (10) and a power electronic unit (1) for controlling an electric machine, said power electronic unit (1) being supported on a carrier (2, 3,) said carrier (2, 3) which is mounted to an engine housing (10) being in the form of a cooler (2), the carrier having a support surface with coolant inlets and outlets (4) and being mounted directly on said engine such that said coolant inlets and outlets in said support surface are in direct sealed communication with coolant passages (11) of a cooling circuit of the internal combustion engine (10).

2. A drive arrangement according to claim 1, wherein the carrier (2, 3,) is arranged in a positively engaging fashion on an engine block.

3. A drive arrangement according to claim 2, wherein a seal (9) is provided between said carrier (2, 3) and said engine block (10).

4. A drive arrangement according to claim 1, wherein the carrier (2, 3,) of the power electronic unit (1) includes a cooler (2) and an adapter plate (3) having coolant inlets and outlets leading to the cooler (2) and being arranged so as to fit coolant passages (11) of a particular internal combustion engine.

5. A drive arrangement according to claim 1, wherein said power electronic unit (1) controls an electric machine which can be operated selectively as a starter and a generator.

* * * * *